US008451654B2

(12) United States Patent
Koike

(10) Patent No.: US 8,451,654 B2
(45) Date of Patent: May 28, 2013

(54) SEMICONDUCTOR MEMORY DEVICE

(75) Inventor: Tsuyoshi Koike, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/251,596

(22) Filed: Oct. 3, 2011

(65) Prior Publication Data

US 2012/0026782 A1 Feb. 2, 2012

Related U.S. Application Data

(63) Continuation of application No. PCT/JP2010/001340, filed on Feb. 26, 2010.

(30) Foreign Application Priority Data

Jul. 2, 2009 (JP) ................... 2009-157863

(51) Int. Cl.
*G11C 11/00* (2006.01)
(52) U.S. Cl.
USPC ............. 365/156; 365/154; 365/63; 365/174; 365/181; 365/188
(58) Field of Classification Search
USPC .................... 365/154, 156, 63, 174, 181, 188
See application file for complete search history.

(56) References Cited

U.S. PATENT DOCUMENTS

| 5,392,249 | A | * | 2/1995 | Kan .............................. 365/203 |
| 7,525,854 | B2 | * | 4/2009 | Huang ...................... 365/189.15 |
| 2001/0033511 | A1 | | 10/2001 | Saito et al. |
| 2002/0186579 | A1 | | 12/2002 | Yokozeki et al. |
| 2004/0027852 | A1 | * | 2/2004 | Watanabe et al. ............. 365/154 |
| 2004/0141395 | A1 | * | 7/2004 | Ohtsuki et al. ................ 365/210 |
| 2005/0286323 | A1 | | 12/2005 | Ohtsuki et al. |

FOREIGN PATENT DOCUMENTS

| JP | 60-214560 | 10/1985 |
| JP | 2001-266576 | 9/2001 |
| JP | 2002-367377 | 12/2002 |
| JP | 2004-071118 | 3/2004 |
| JP | 2004-220721 | 8/2004 |
| JP | 2006-012240 | 1/2006 |

* cited by examiner

*Primary Examiner* — Fernando N. Hidalgo
(74) *Attorney, Agent, or Firm* — McDermott Will & Emery LLP

(57) ABSTRACT

In two inverters included in a latch in a memory cell, the source or drain of a PMOS load transistor connected to a memory node is cut off, and the source or drain of an NMOS drive transistor connected to another memory node is cut off, whereby internal data is fixed or permanently stored in the memory cell while ensuring a resistance to damage to the gate of the transistor and without impairing the regularity of the layout.

14 Claims, 12 Drawing Sheets

SEMICONDUCTOR MEMORY DEVICE

CROSS-REFERENCE TO RELATED APPLICATIONS

This is a continuation of PCT International Application PCT/JP2010/001340 filed on Feb. 26, 2010, which claims priority to Japanese Patent Application No. 2009-157863 filed on Jul. 2, 2009. The disclosures of these applications including the specifications, the drawings, and the claims are hereby incorporated by reference in their entirety.

BACKGROUND

The present disclosure relates to fixation or permanent storage of data in memory cells of semiconductor memory devices.

In semiconductor memory devices using static random access memory (SRAM) memory cells, sense amplifiers are typically used to amplify data read from the memory cells. A replica read circuit is often used as a circuit for generating a timing signal for activation of the sense amplifier. The replica read circuit reads data from a memory cell in which fixed or permanently stored data is previously provided, and at that time, generates a control signal for the sense amplifier.

FIG. 1 is a circuit diagram showing a conventional SRAM memory cell in which internal data is fixed or permanently stored. The memory cell 100 of FIG. 1 includes two inverters 101 and 102 which form a latch. Reference characters PL0 and PL1 indicate PMOS load transistors, reference characters ND0 and ND1 indicate NMOS drive transistors, reference characters NA0 and NA1 indicate NMOS access transistors, a reference character VDD indicates a power supply voltage, and a reference character VSS indicates a ground voltage. Reference characters 103 and 104 indicate memory nodes, a reference character 105 indicates a word line, and reference characters 106a and 106b indicate complementary bit lines. As shown in FIG. 1, conventionally, in order to previously provide fixed or permanently stored data, one (104) of the memory nodes of the memory cell 100 is fixed or connected directly to the ground voltage VSS, for example (see Japanese Patent Publication No. 2002-367377 (FIG. 6)).

However, if the memory node of the memory cell is fixed or connected directly to the power supply, a leakage current increases. For example, if the memory node 104 is fixed or connected directly to the ground voltage VSS as shown in FIG. 1, the power supply voltage VDD and the ground voltage VSS are connected directly to the opposite ends of the PMOS load transistor PL1, so that a large leakage current flows.

Moreover, in recent years, as the size has been reduced and the speed has been increased, the thickness of the gate oxide film of transistors has been decreased, so that the resistance to dielectric breakdown has tended to decrease. Therefore, if the gate electrode of a transistor is connected directly to a power supply, the gate oxide film is easily damaged by electrostatic discharge (ESD).

Therefore, there is, for example, a method of fixing or permanently setting the gate to a predetermined level using an output signal of a fixation-dedicated circuit. However, in recent years, the size of SRAM memory cells has been shrinking, and therefore, it has become difficult to ensure a channel region for providing a new interconnect which is extended into the inside of the cell.

As a result of the size reduction, the memory cell shrunk to the maximum degree for reduction of the area is susceptible to variations. A disturbance of the regularity of the layout would have a significant influence on variations and therefore yield.

In such a situation, it is difficult to fix or permanently store data without fixing or connecting the gate directly to the power supply, providing a new interconnect, or disturbing the layout regularity.

SUMMARY

The present disclosure describes implementations of a technique of providing fixed or permanently stored data in a memory cell array including memory cells each including a latch (memory circuit) in which two inverters are cross-coupled (i.e., the output of each inverter is connected to an input of the other inverter) without fixing or connecting the gate directly to the power supply, providing a new interconnect, or disturbing the layout regularity. Specifically, in any memory cell, the source or drain of a PMOS transistor included in one of the inverters is cut off and the source or drain of an NMOS transistor included in the other inverter is cut off.

According to the present disclosure, a memory cell with fixed or permanently stored data can be provided at any position on a memory array without damage on the gate due to ESD, an increase in the size, or a disturbance of the regularity of the layout. Also, the gate of the transistor is not fixed or connected directly to a power supply, whereby an increase in leakage current can be reduced or prevented. Moreover, when masks are modified, fixation or permanent storage can be changed using a minimum number of masks.

DETAILED DESCRIPTION

The present disclosure will be described in detail hereinafter with reference to embodiments shown in the accompanying drawings that are intended to illustrate but not limit the present disclosure.

First Embodiment

Figure 1:
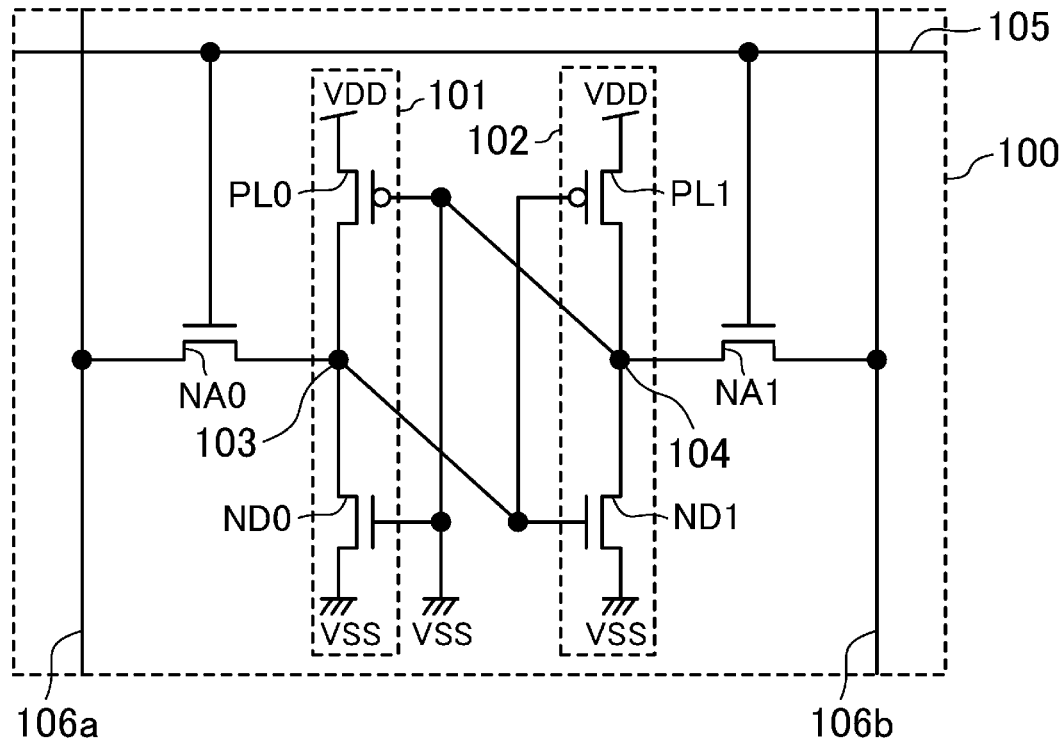
FIG. 1 is a circuit diagram showing a conventional memory cell in which internal data is fixed or permanently stored.
Figure 2:
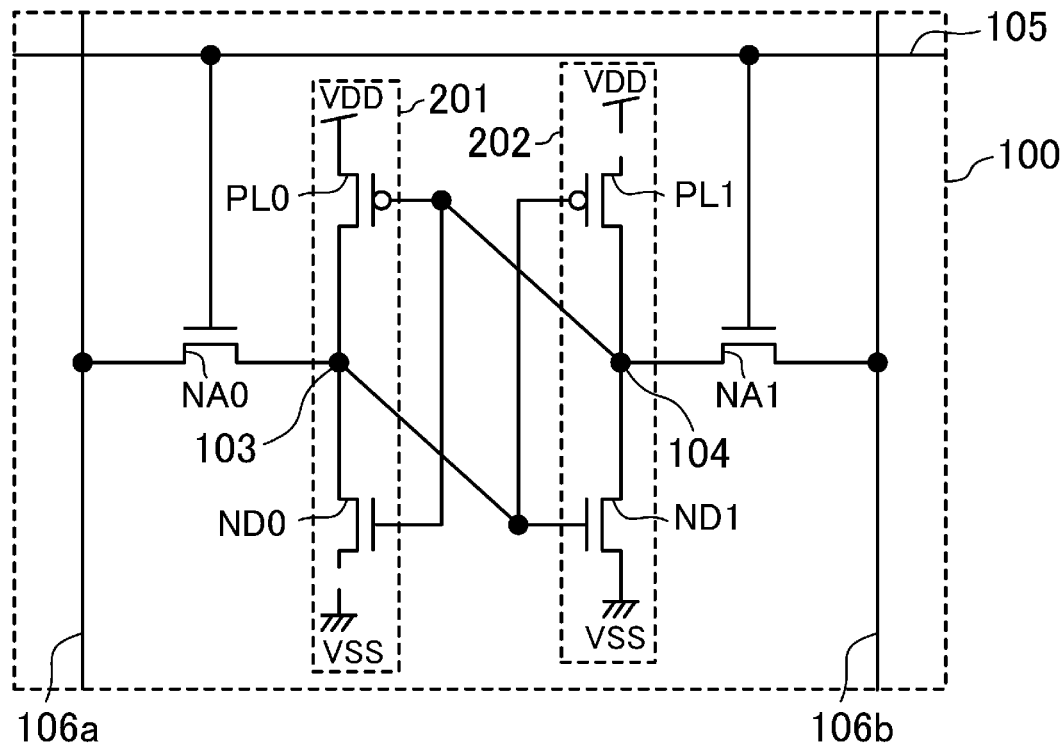
FIG. 2 is a circuit diagram showing a memory cell according to a first embodiment of the present disclosure.

FIG. 2 is a circuit diagram showing a memory cell according to a first embodiment of the present disclosure. In FIG. 2, two inverters 201 and 202 form a latch, the source of a drive transistor (NMOS) ND0 included in the inverter 201 is cut off from a ground voltage VSS, and the source of a load transistor (PMOS) PL1 included in the inverter 202 is cut off from a power supply voltage VDD.

A mechanism for fixing or permanently storing internal data in this circuit will be described.

The drain of a load transistor PL0, the gates of the load transistor PL1 and a drive transistor ND1, and the drain of an access transistor NA0 are connected to a memory node 103. The drain of the drive transistor ND1, the gates of the load transistor PL0 and the drive transistor ND0, and the drain of an access transistor NA1 are connected to a memory node 104.

When a power supply is turned on, the memory nodes 103 and 104 are both at an indefinite level. In other words, the gates of the load transistor PL0 and the drive transistor ND1 are at an indefinite level. A high-level subthreshold leakage current flows into the memory node 103 due to the load transistor PL0. A gate leakage current flowing into the memory node 103 via the gates of the load transistor PL1 and the drive transistor ND1 is negligible compared to the leakage current flowing into the memory node 103 via the load transistor PL0, and therefore, the memory node 103 goes high after a predetermined period of time. A slight amount of subthreshold leakage current of a bit line 106a precharged to the high level is likely to flow into the memory node 103 via the access transistor NA0, but acts to help fix or permanently set the memory node 103 to the high level, and therefore, a problem does not arise. When the memory node 103 goes high, the drive transistor ND1 is turned on to drive the memory node 104 to the low level. Thus, the memory nodes 103 and 104 are fixed or permanently set to the high and low levels, respectively.

Figure 3:
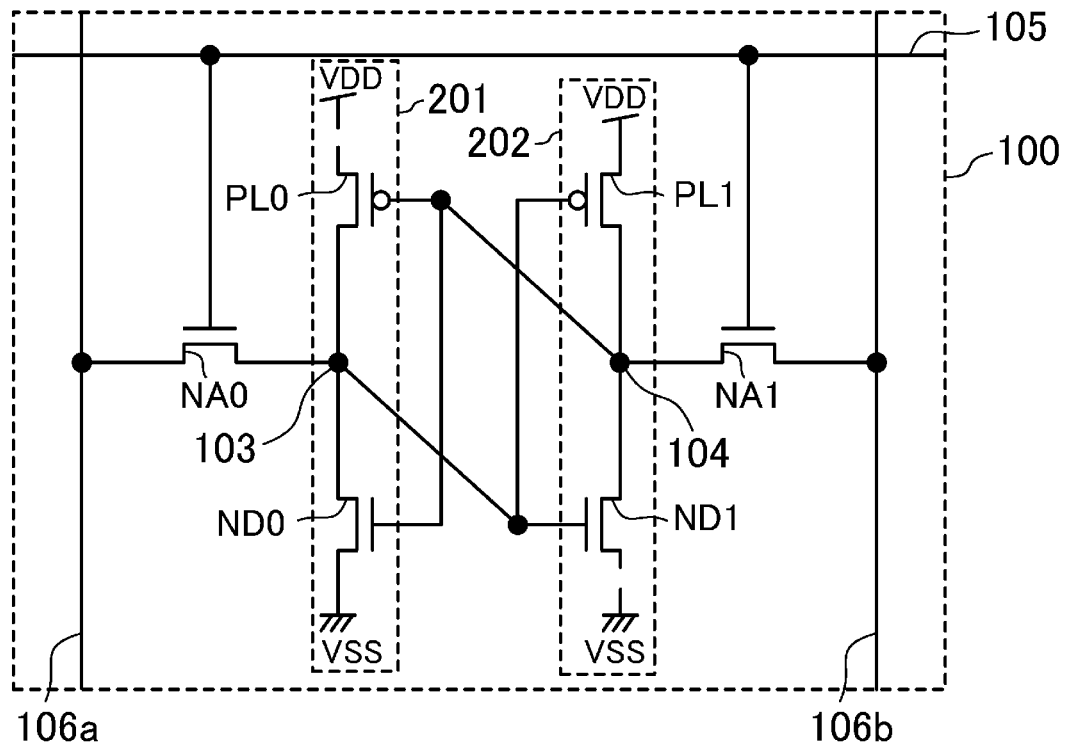
FIG. 3 is a circuit diagram showing another configuration of the first embodiment of the present disclosure.

FIG. 3 is a circuit diagram where data complementary to that of FIG. 2 is fixed or permanently stored in a memory cell. In FIG. 3, two inverters 201 and 202 form a latch, the source of a drive transistor ND1 included in the inverter 202 is cut off from a ground voltage VSS, and the source of a load transistor PL0 included in the inverter 201 is cut off from a power supply voltage VDD. In this case, memory nodes 103 and 104 are fixed or permanently set to the low and high levels, respectively.

An advantage of the configurations of FIGS. 2 and 3 is that the gate of the transistor is not fixed or connected directly to the power supply and therefore an increase in the leakage current can be reduced or prevented.

Because the gate of the transistor is not fixed or connected directly to the power supply, the damage of the gate insulating film due to ESD can be reduced or prevented.

It is not necessary to provide an interconnection channel in order to connect an output signal from a fixation-dedicated circuit to a memory cell for fixation or permanent storage of internal data. Therefore, even if there is no room in the interconnection channel, the overhead of the layout does not occur.

A disturbance of the regularity of a local layout caused by introducing a fixation signal can be reduced or prevented, whereby variations in the memory cell can be reduced, and therefore, the yield can be increased.

When a mask is modified, the mask modification can be easily performed for a minimum number of layers, whereby the cost and number of steps of the modification can be reduced.

In a memory mat on which SRAM memory cells are arranged in an array and there is no room for an interconnection channel for providing an interconnect for a fixation signal, memory cells fixed or permanently set to different values can be arranged in the same column or row.

When there is no room for providing a fixation-dedicated circuit in a peripheral circuit, the gate of a transistor in the peripheral circuit can be fixed by utilizing the output of the memory cell with fixed or permanently stored internal data.

The bit line, word line, and power supply line which pass through the memory cell with fixed or permanently stored internal data are not used to fix or permanently store the internal data. Therefore, the word line and bit line which are input to a memory cell adjacent to the memory cell with fixed or permanently stored internal data immediately or via a plurality of memory cells can be used similar to when a normal memory cell is written or read.

Figure 4:
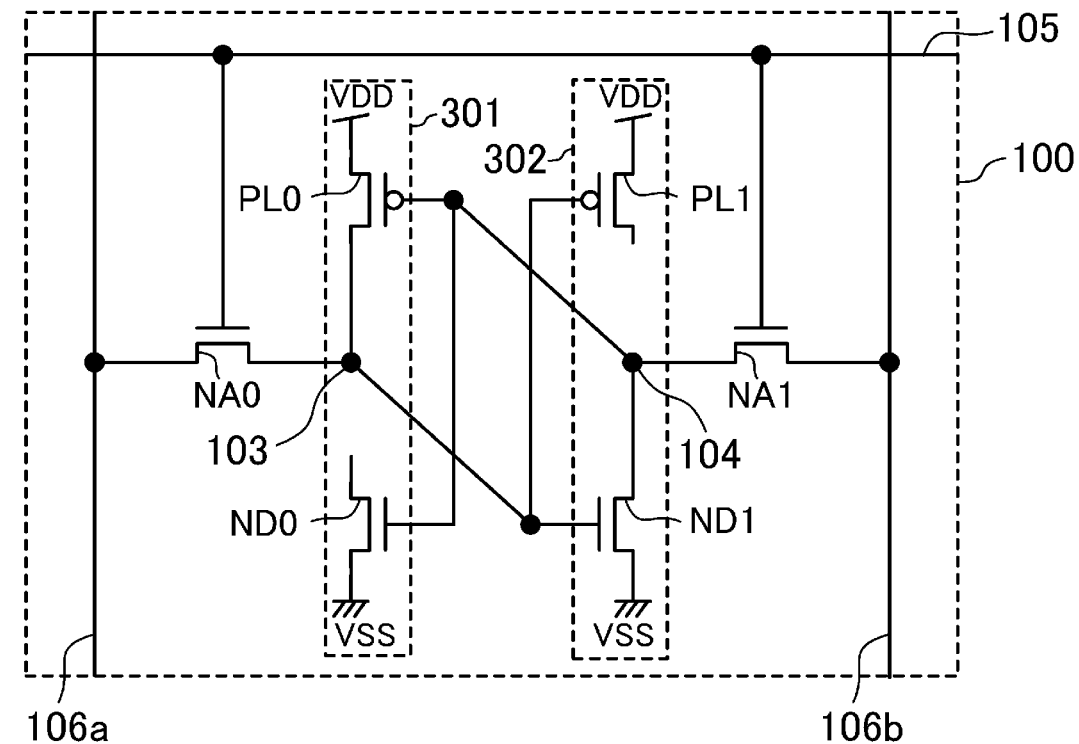
FIG. 4 is a circuit diagram showing still another configuration of the first embodiment of the present disclosure.

FIG. 4 is a circuit diagram showing another configuration according to the first embodiment of the present disclosure. In FIG. 4, two inverters 301 and 302 form a latch, the drain of a drive transistor ND0 included in the inverter 301 is cut off from a memory node 103, and the drain of a load transistor PL1 included in the inverter 302 is cut off from a memory node 104. A mechanism for data fixation or permanent storage and advantages thereof are similar to those of the embodiment of FIG. 2.

Figure 5:
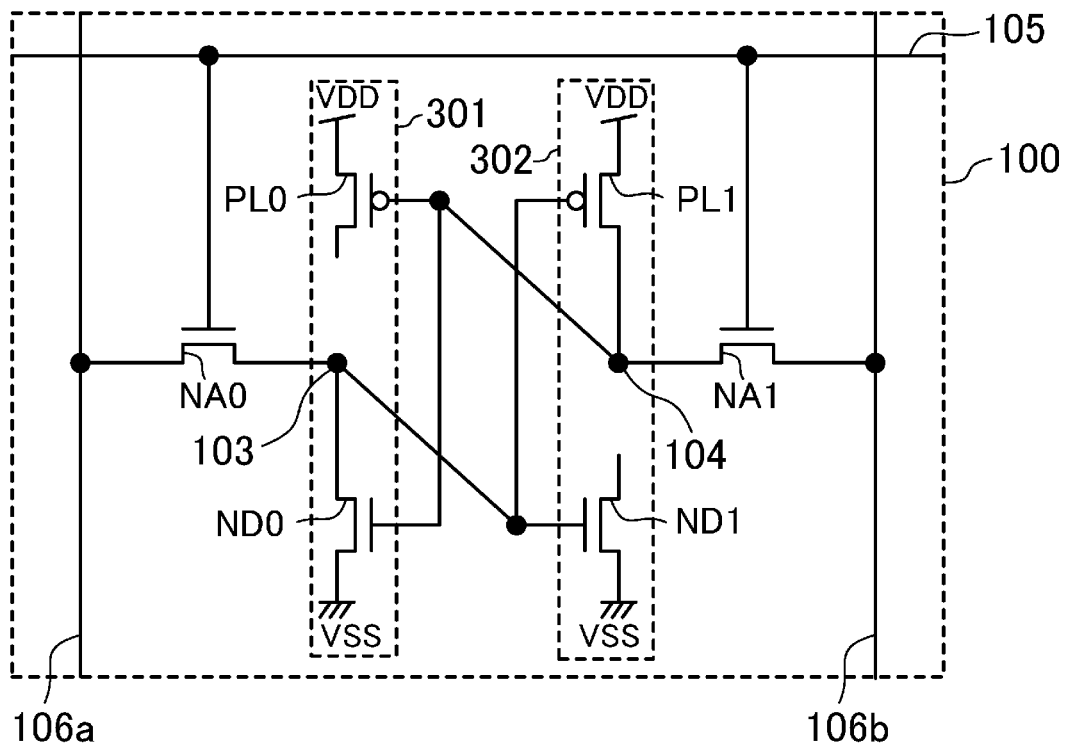
FIG. 5 is a circuit diagram showing still another configuration of the first embodiment of the present disclosure.

FIG. 5 is a circuit diagram where data complementary to that of FIG. 4 is fixed or permanently stored in a memory cell. In FIG. 5, two inverters 301 and 302 form a latch, the drain of a drive transistor ND1 included in the inverter 302 is cut off from a memory node 104, and the drain of a load transistor PL0 included in the inverter 301 is cut off from a memory node 103.

Figure 6:
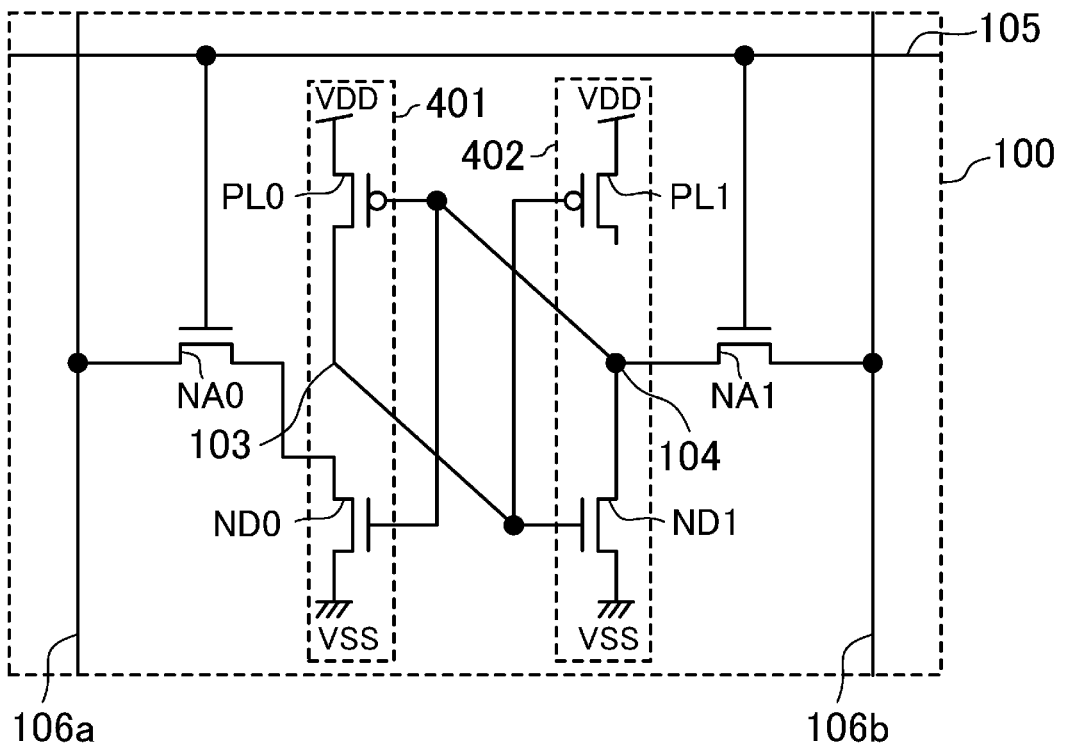
FIG. 6 is a circuit diagram showing still another configuration of the first embodiment of the present disclosure.

FIG. 6 is a circuit diagram showing another configuration according to the first embodiment of the present disclosure. In a typical SRAM memory cell, the access transistor NA0 and the drive transistor ND0 have a common drain and the access transistor NA1 and the drive transistor ND1 have a common drain. Therefore, it is not possible to cut off only the drive transistor from the memory node. In such a case, in the memory cell of FIG. 6 including inverters 401 and 402, if the drive transistor ND0 is cut off from the memory node 103 in the inverter 401, the access transistor NA0 is cut off from the memory node 103 at the same time. A mechanism for fixation or permanently storage of internal data in the circuit of FIG. 6 is similar to that of the circuit of FIG. 2.

Figure 7:
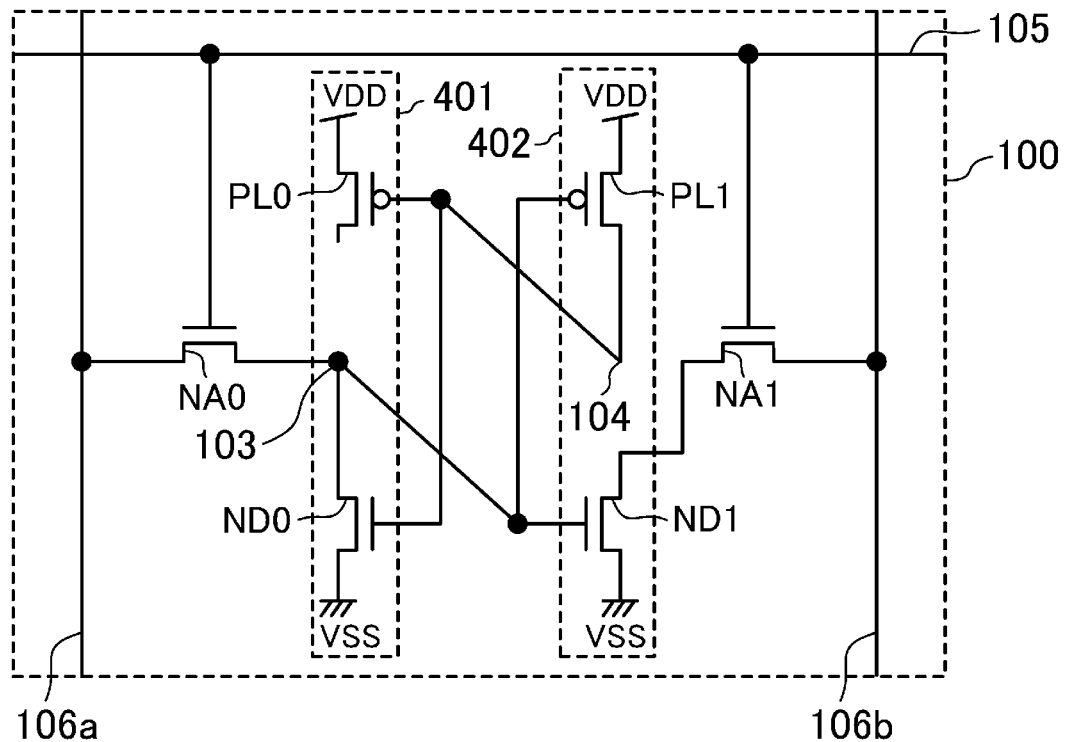
FIG. 7 is a circuit diagram showing still another configuration of the first embodiment of the present disclosure.

FIG. 7 is a circuit diagram where data complementary to that of FIG. 6 is fixed or permanently stored in a memory cell. In FIG. 7, if the drive transistor ND1 is cut off from the memory node 104 in the inverter 402, the access transistor NA1 is cut off from the memory node 104 at the same time.

Figure 8:
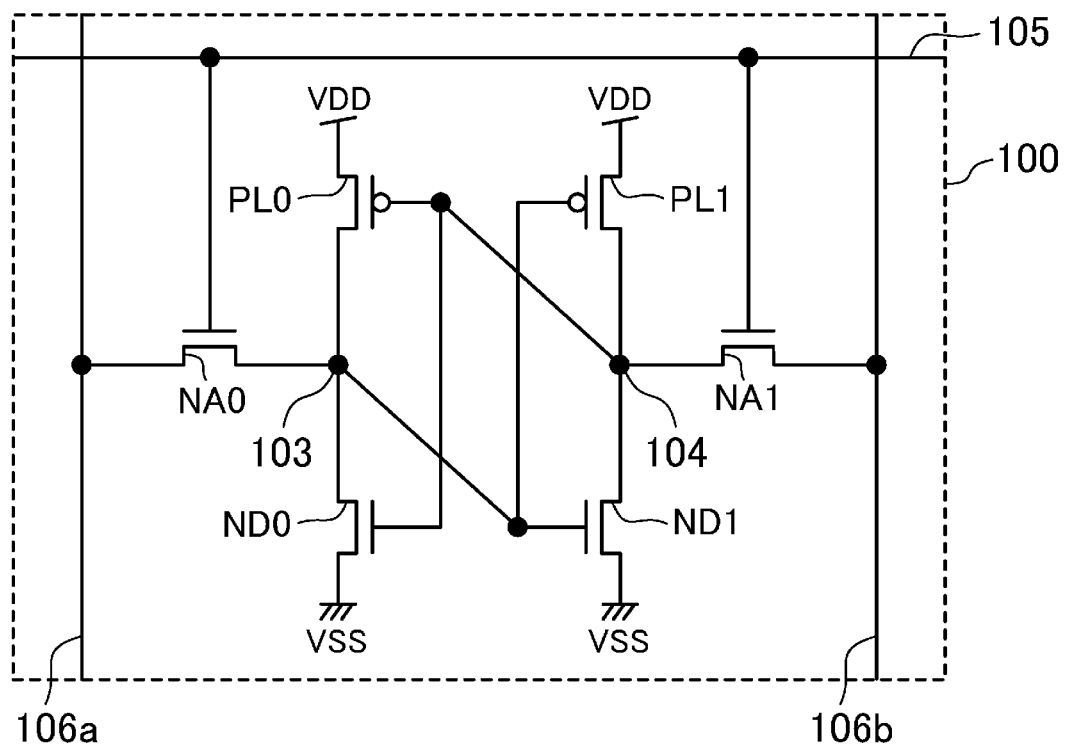
FIG. 8 is a circuit diagram showing a conventional SRAM memory cell.
Figure 9:
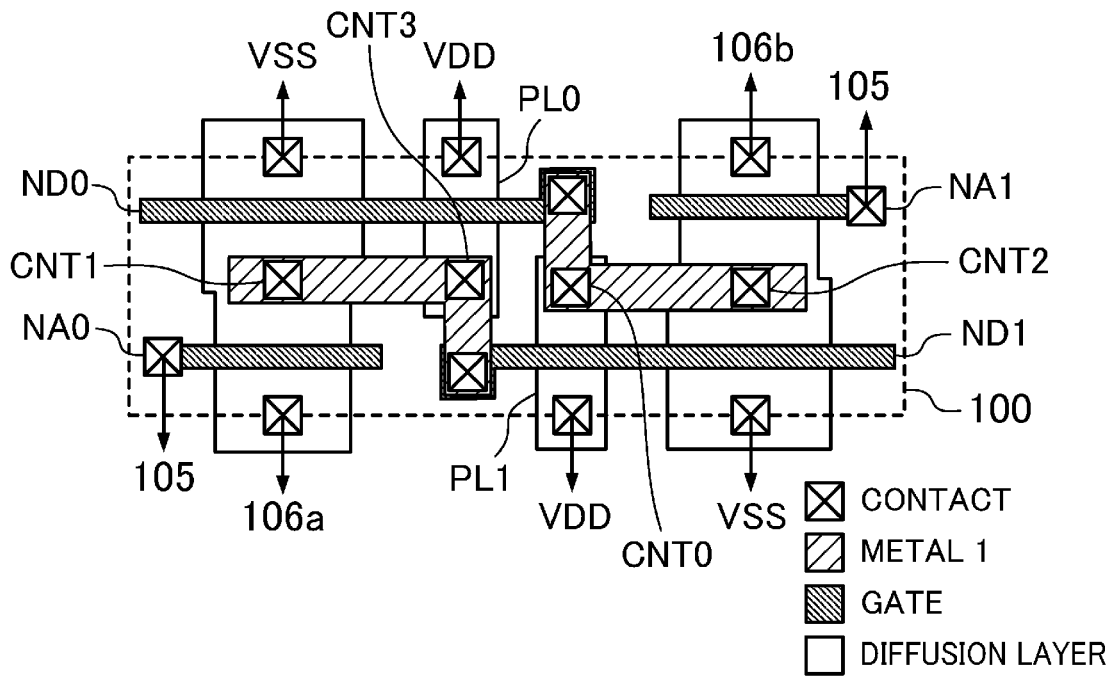
FIG. 9 is a diagram showing a layout corresponding to the circuit of FIG. 8.
Figure 10:
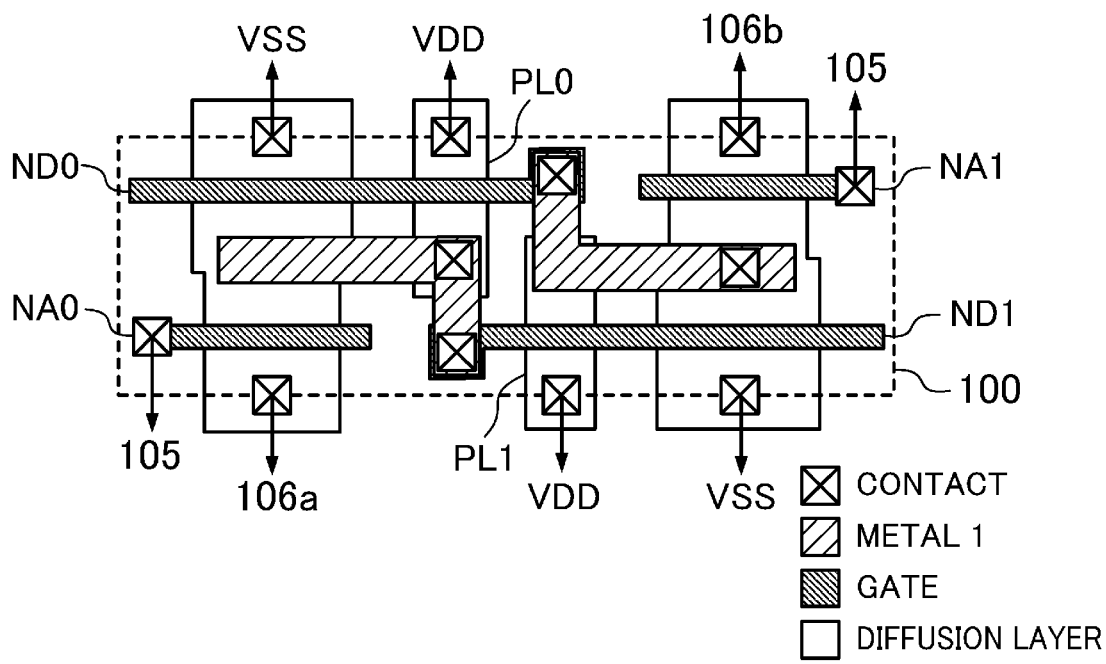
FIG. 10 is a diagram showing a layout corresponding to the circuit of FIG. 6.
Figure 11:
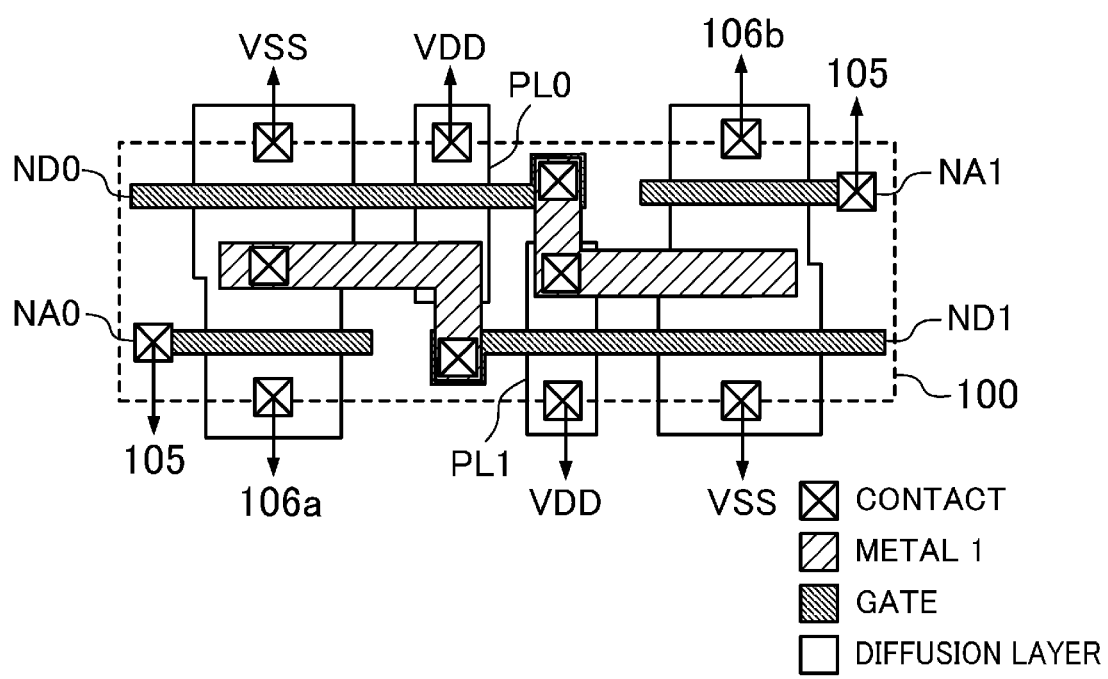
FIG. 11 is a diagram showing a layout corresponding to the circuit of FIG. 7.

FIG. 8 is a circuit diagram showing a conventional, typical SRAM memory cell. FIG. 9 is a diagram showing a layout corresponding to FIG. 8. FIG. 10 is a diagram showing a layout corresponding to FIG. 6. FIG. 11 is a diagram showing a layout corresponding to FIG. 7. As shown in FIG. 10, only by removing two contacts CNT0 and CNT1 in FIG. 9, data can be fixed or permanently stored in a memory cell 100 as in FIG. 6. As shown in FIG. 11, only by removing two other contacts CNT2 and CNT3 in FIG. 9, data complementary to that of FIG. 6 is fixed or permanently stored in a memory cell 100 as in FIG. 7. Even if it is necessary to modify a mask for the configuration of FIG. 6 to fit the configuration of FIG. 7, only the contact layer needs to be modified, resulting in a decrease in the cost of mask modification.

The configurations of FIGS. 6 and 7 are also effective when the drive transistors ND0 and ND1 have a common source or the load transistors PL0 and PL1 have a common source in adjacent memory cells.

Figure 12:
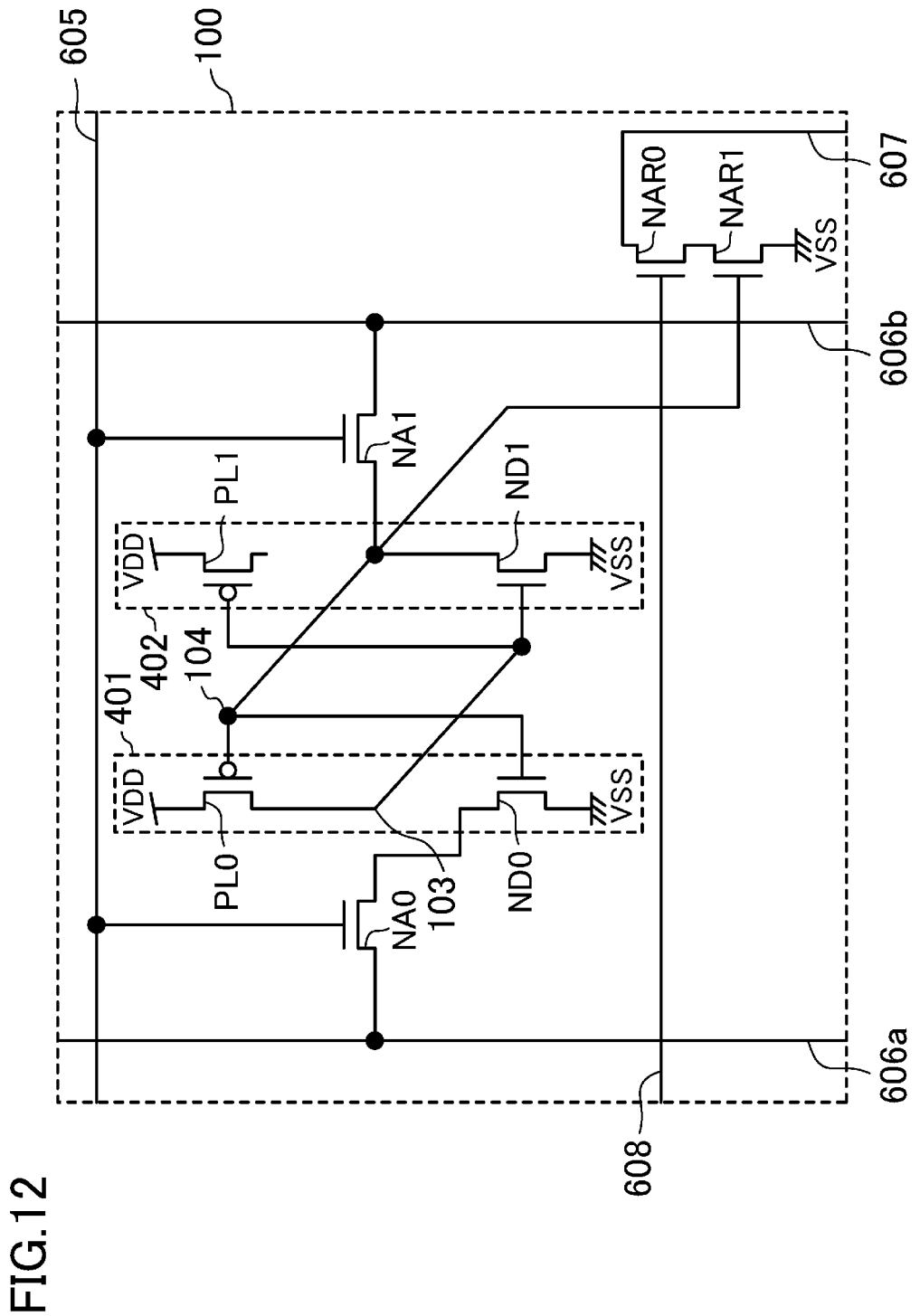
FIG. 12 is a circuit diagram showing still another configuration of the first embodiment of the present disclosure.

FIG. 12 is a circuit diagram showing a memory cell 100 in which a write port and a read port are separately provided. When write operation is performed, a write word line 605 transitions from the low level to the high level. As a result, both access transistors NA0 and NA1 are turned on, and data is written to the memory cell 100, depending on the states of write bit lines 606a and 606b. When read operation is performed, a read word line 608 transitions from the low level to the high level, so that a read transistor NAR0 is turned on. A read transistor NAR1 has transitioned to the on or off state, depending on the state of the memory node 104, until the read word line 608 is activated. A reference character 607 indicates a read data line.

Figure 13:
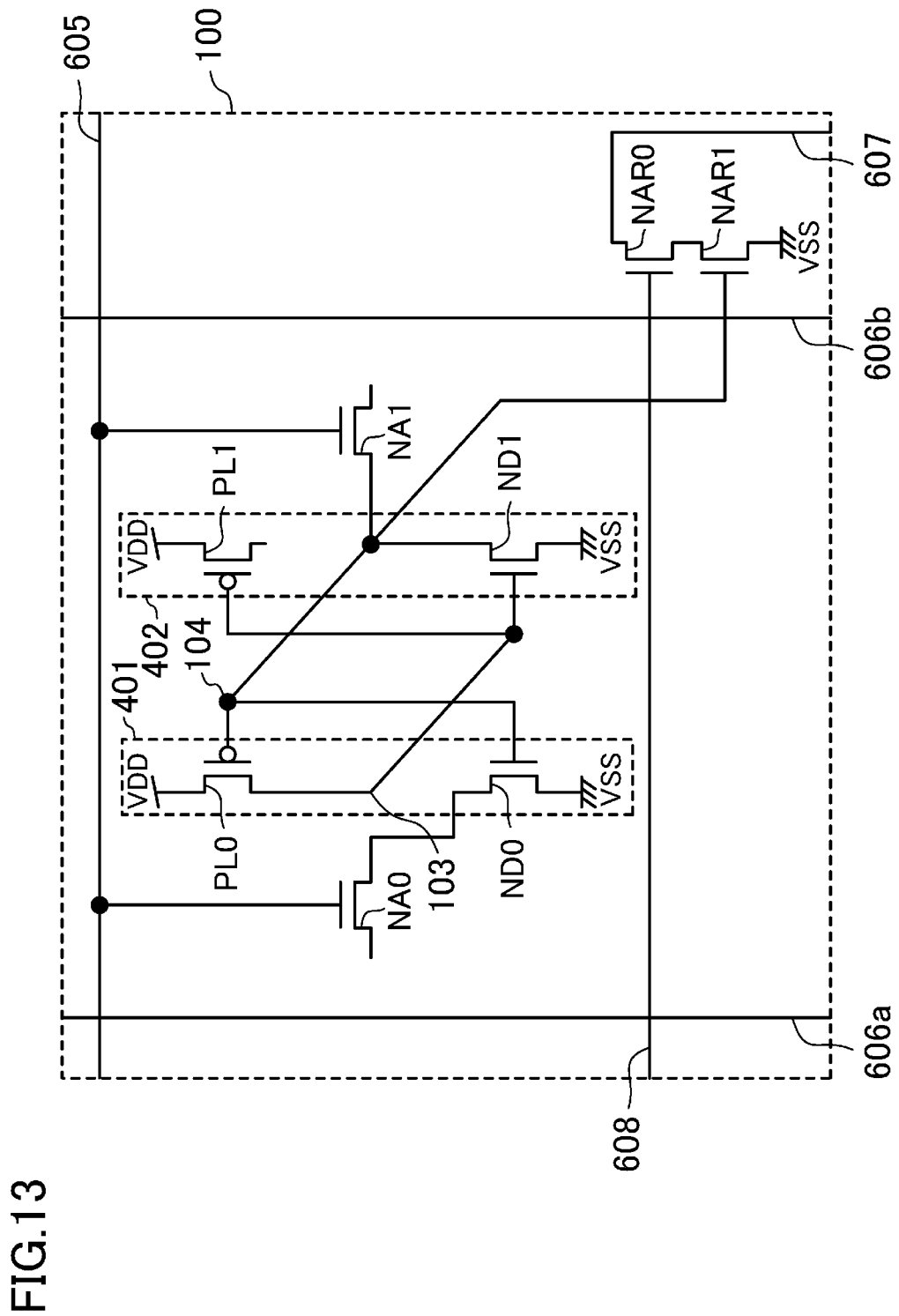
FIG. 13 is a circuit diagram showing still another configuration of the first embodiment of the present disclosure.

The circuit of FIG. 12 is a cell with fixed or permanently stored internal data, and therefore, it is not necessary to write the cell. Therefore, as shown in FIG. 13, the access transistors NA0 and NA1 can be cut off. The circuit of FIG. 13 is more preferable because an unexpected extra leakage current component flowing into both of the memory nodes 103 and 104 can be eliminated.

Figure 14:
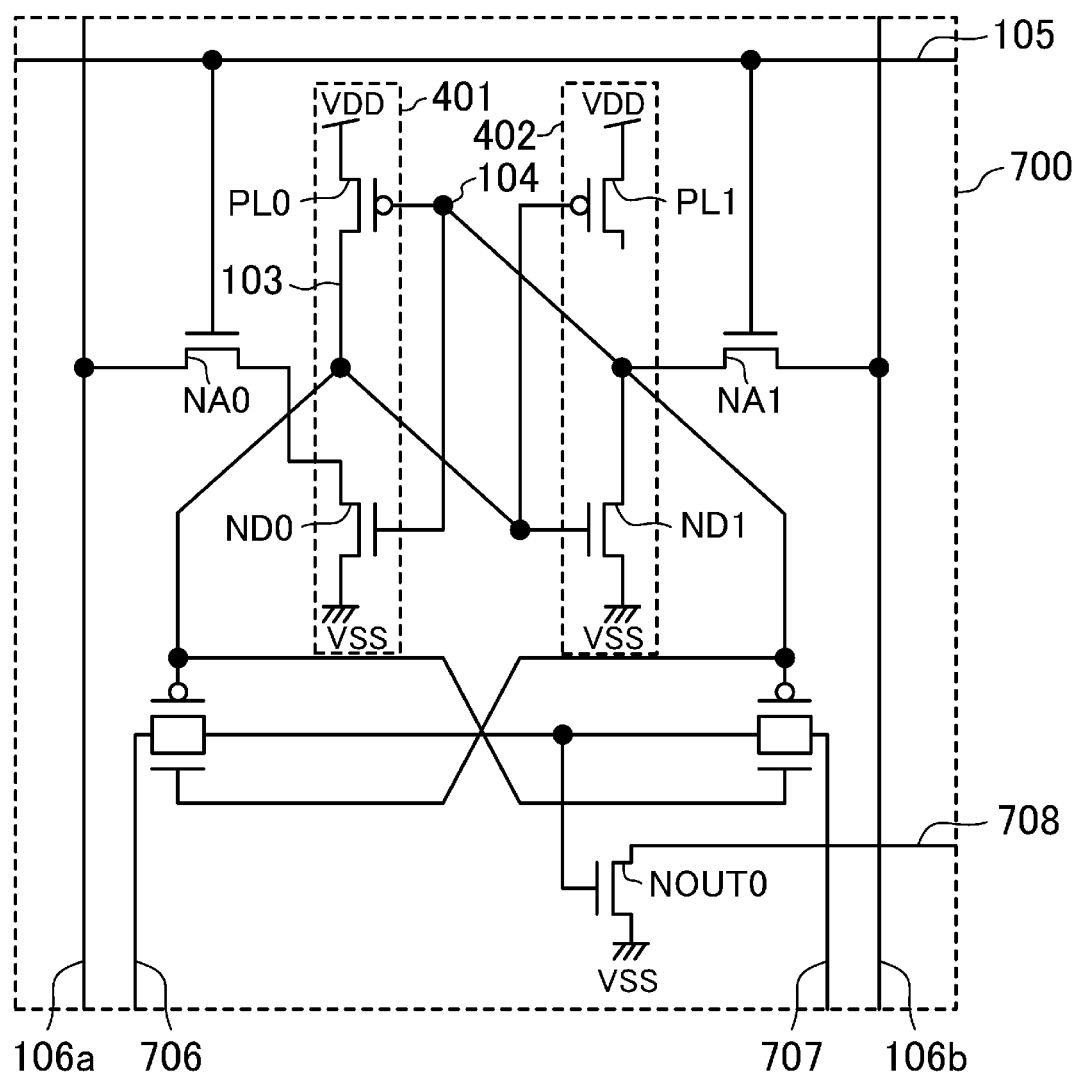
FIG. 14 is a circuit diagram showing still another configuration of the first embodiment of the present disclosure.
Figure 15:
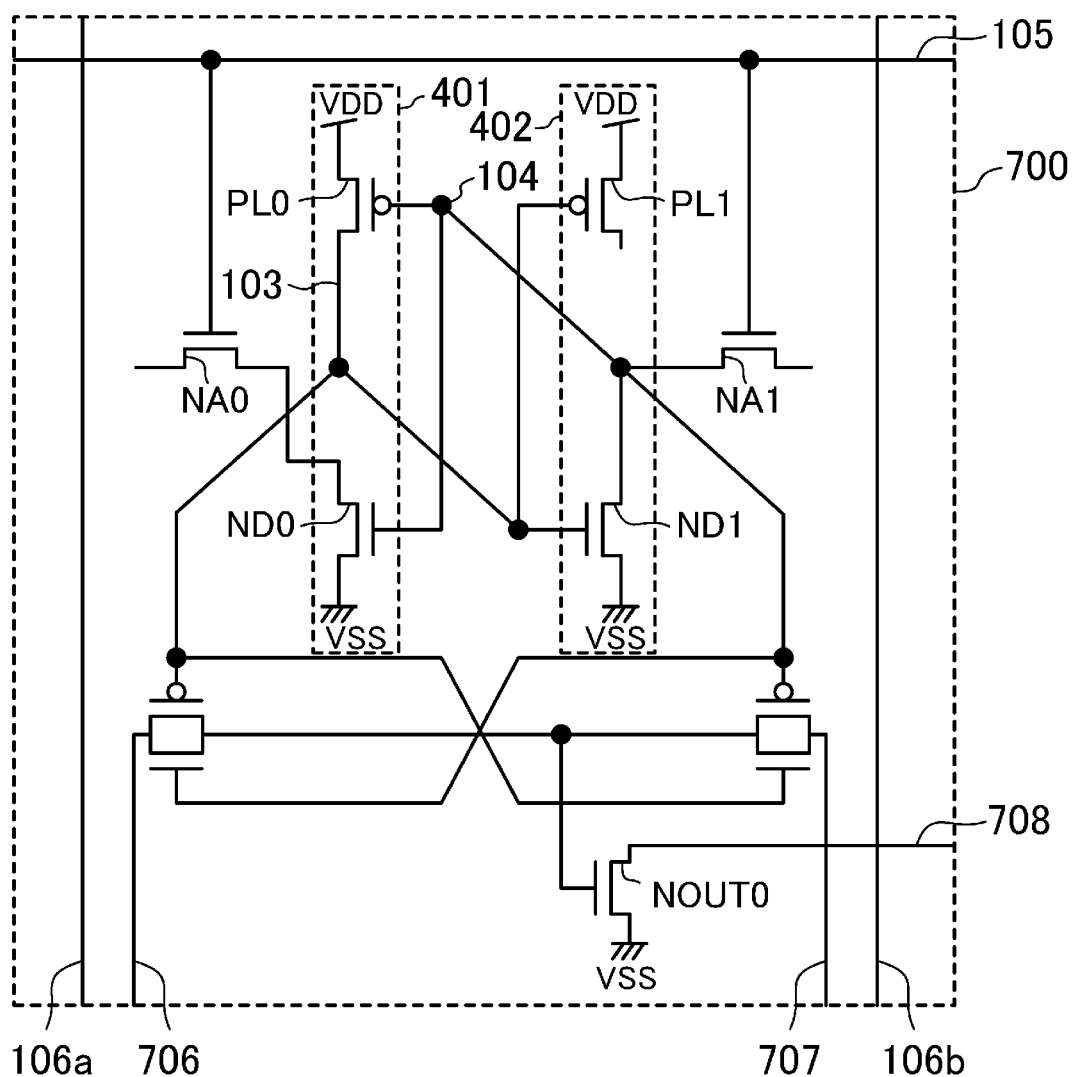
FIG. 15 is a circuit diagram showing still another configuration of the first embodiment of the present disclosure.

FIG. 14 is a diagram showing an example content addressable memory (CAM) cell with fixed or permanently stored internal data. The CAM cell 700 of FIG. 14 is the memory cell 100 of FIG. 6 to which an EOR logical function is added. Read and write operations are performed using the access transistors NA0 and NA1 as in the memory cell 100 of FIG. 6. When compare operation is performed, one of a pair of comparison data bit lines 706 and 707 transitions from the low level to the high level. In this case, an output transistor NOUT0 is turned on or off, depending on the states of the memory nodes 103 and 104, and compare operation is performed by a comparison result output line 708 previously precharged to the high level being maintained high or being discharged to the low level by the output transistor NOUT0. In the circuit of FIG. 14, when read data from the CAM cell 700 is not used, the access transistors NA0 and NA1 can be cut off from the bit lines 106a and 106b as shown in FIG. 15. The circuit configuration of FIG. 15 is more preferable because an unexpected extra leakage current component flowing into both of the memory nodes 103 and 104 can be eliminated.

Second Embodiment

Figure 16:
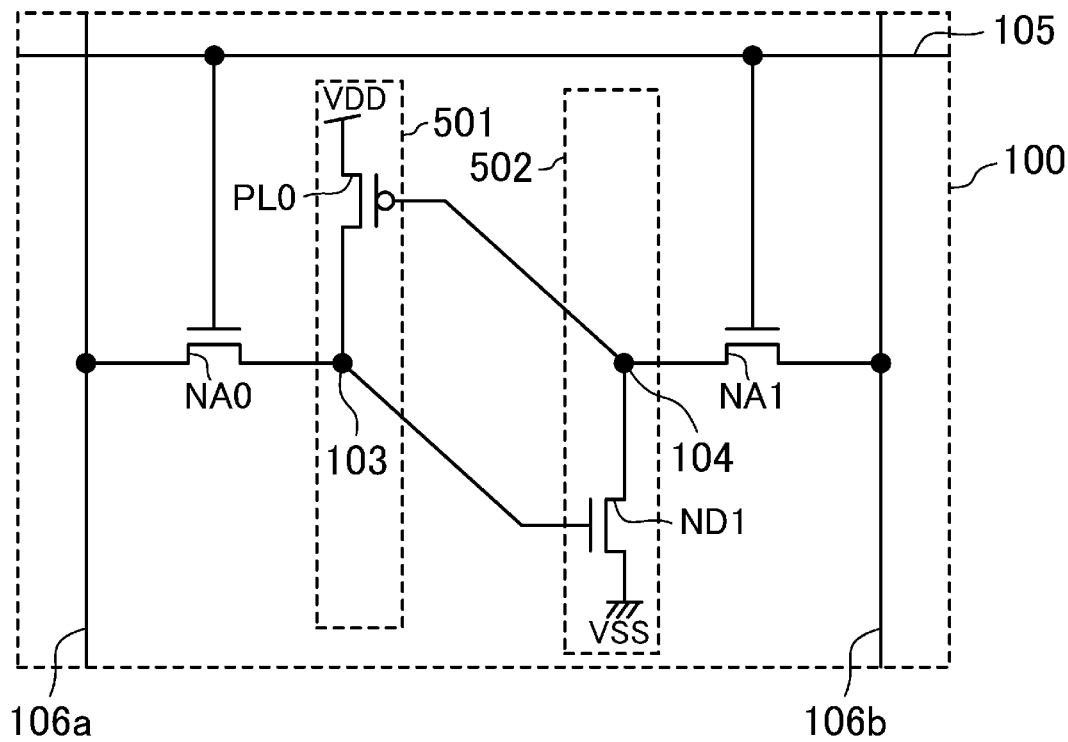
FIG. 16 is a circuit diagram showing a second embodiment of the present disclosure.

FIG. 16 is a circuit diagram showing a memory cell according to a second embodiment of the present disclosure. The circuit of FIG. 16 is different from that of FIG. 6 in that inverters 501 and 502 of FIG. 16 do not include the drive transistor ND0 and load transistor PL1 of FIG. 6. The regularity of the layout is disadvantageously lower than that of FIG. 6, but it is advantageously unnecessary to connect the output of the fixation-dedicated circuit to the memory cell, which is an advantage over the conventional art.

Figure 17:
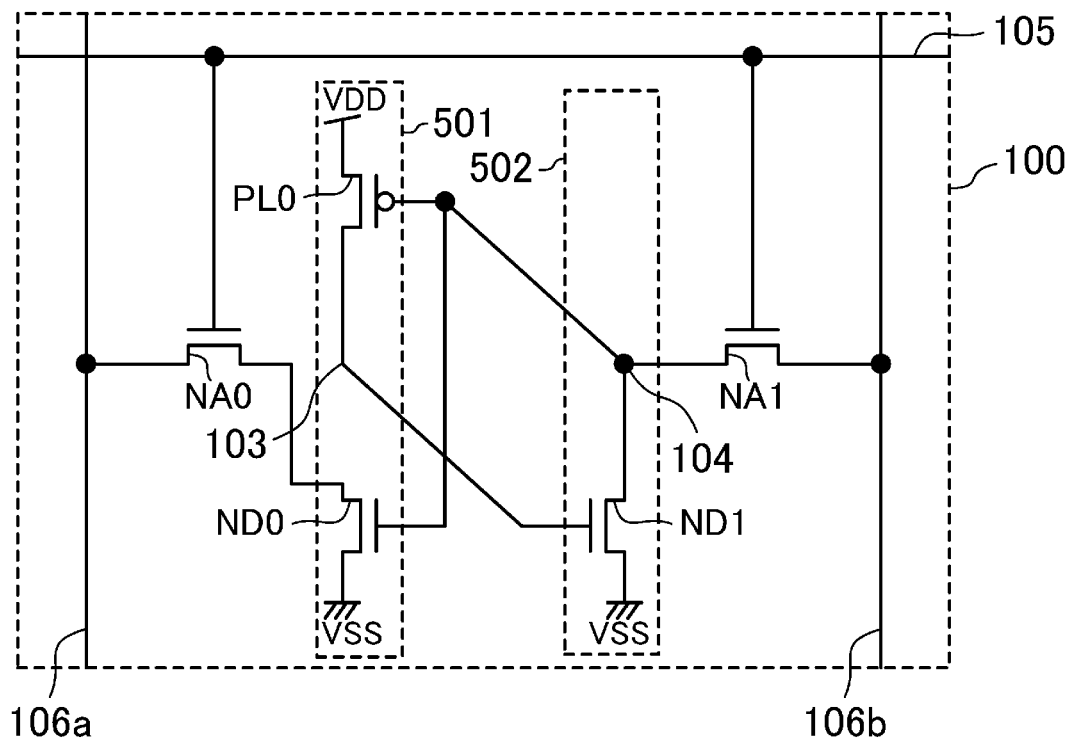
FIG. 17 is a circuit diagram showing another configuration of the second embodiment of the present disclosure.

FIG. 17 is a circuit diagram showing another configuration according to the second embodiment of the present disclosure. In inverters 501 and 502 of FIG. 17, only the load transistor PL1 of FIG. 6 is excluded. The configuration of FIG. 17 also has an advantage and a disadvantage which are similar to those of FIG. 16.

Figure 18:
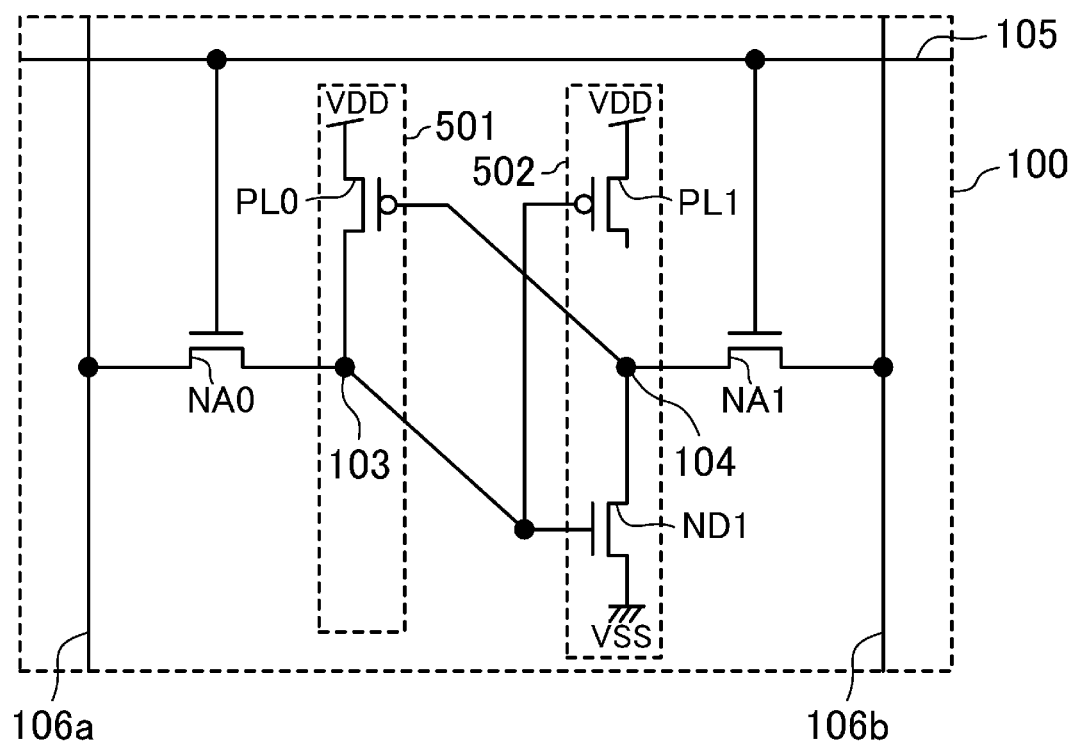
FIG. 18 is a circuit diagram showing still another configuration of the second embodiment of the present disclosure.

FIG. 18 is a circuit diagram showing still another configuration according to the second embodiment of the present disclosure. In inverters 501 and 502 of FIG. 18, only the drive transistor ND0 of FIG. 6 is excluded. The configuration of FIG. 18 also has an advantage and a disadvantage which are similar to those of FIG. 16.

As described above, according to the semiconductor memory device of the present disclosure, a memory cell with fixed or permanently stored data can be provided at any position on a memory array without damage on the gate due to ESD, an increase in the size, or a disturbance of the regularity of the layout. Therefore, the semiconductor memory device of the present disclosure is useful for SRAM etc.

What is claimed is:

1. A semiconductor memory device comprising:
a memory cell including:
  a latch circuit comprising a first inverter circuit and a second inverter circuit, where an output of the first inverter circuit is connected to an input of the second inverter circuit, and an output of the second inverter circuit is connected to an input of the first inverter circuit; and
  a read circuit configured to read from the latch circuit, wherein:
the first inverter circuit includes a first PMOS transistor and a first NMOS transistor,
the second inverter circuit includes a second PMOS transistor and a second NMOS transistor,
at least one of a source and a drain of the first NMOS transistor is cut off and a first voltage is supplied to a source of the first PMOS transistor in the first inverter circuit, and
at least one of a source and a drain of the second PMOS transistor is cut off and a second voltage lower than the first voltage is supplied to a source of the second NMOS transistor in the second inverter circuit.

2. The semiconductor memory device of claim 1, wherein:
the source of the second PMOS transistor is cut off,
the source of the first NMOS transistor is cut off,
a drain of the first PMOS transistor, the drain of the first NMOS transistor, a gate of the second PMOS transistor and a gate of the second NMOS transistor are connected so as to form a first memory node, and
the drain of the second PMOS transistor, a drain of the second NMOS transistor, a gate of the first PMOS transistor and a gate of the first NMOS transistor are connected so as to form a second memory node.

3. The semiconductor memory device of claim 2, wherein the read circuit includes:
a third NMOS transistor having a source connected to a first bit line, a gate connected to a word line and a drain connected to the first memory node; and
a fourth NMOS transistor having a source connected to a second bit line complementary to the first bit line, a gate connected to the world line and a drain connected to the second memory node.

4. The semiconductor memory device of claim 1, wherein:
the drain of the second PMOS transistor is cut off,
the drain of the first NMOS transistor is cut off, a drain of the first PMOS transistor, a gate of the second PMOS transistor and a gate of the second NMOS transistor are connected so as to form a first memory node, and a drain of the second NMOS transistor, a gate of the first PMOS transistor and a gate of the first NMOS transistor are connected so as to form a second memory node.

5. The semiconductor memory device of claim 4, wherein the read circuit includes:

a third NMOS transistor having a source connected to a first bit line, a gate connected to a word line and a drain connected to the first memory node; and a fourth NMOS transistor having a source connected to a second bit line complementary to the first bit line, a gate connected to the world line and a drain connected to the second memory node.

6. A semiconductor memory device comprising:
a memory cell including:
a latch circuit comprising a first inverter circuit and a second inverter circuit, where an output of the first inverter circuit is connected to an input of the second inverter circuit, and an output of the second inverter circuit is connected to an input of the first inverter circuit; and
a read circuit configured to read from the latch circuit, wherein:
the first inverter circuit includes a first PMOS transistor and a first NMOS transistor, the second inverter circuit includes a second PMOS transistor and a second NMOS transistor,
the read circuit includes a third NMOS transistor having a source connected to a first bit line, a gate connected to a word line and a drain,
a drain of the first PMOS transistor, a gate of the second PMOS transistor and a gate of the second NMOS transistor are connected,
a drain of the second NMOS transistor, a gate of the first PMOS transistor and a gate of the first NMOS transistor are connected,
a drain of the first NMOS transistor is connected to the drain of the third NMOS transistor and is cut off from the drain of the first PMOS transistor, and
a drain of the second PMOS transistor is cut off.

7. The semiconductor memory device of claim 6, wherein the read circuit further includes a fourth NMOS transistor having a source connected to a second bit line complementary to the first bit line, a gate connected to the world line and a drain connected to the drain of the second NMOS transistor.

8. A semiconductor memory device comprising:
a memory cell including:
a latch circuit comprising a first inverter circuit and a second inverter circuit, where an output of the first inverter circuit is connected to an input of the second inverter circuit, and an output of the second inverter circuit is connected to an input of the first inverter circuit; and
a read circuit configured to read from the latch circuit, wherein:
the first inverter circuit includes a first PMOS transistor, a drain of which is the output of the first inverter circuit and is connected to the input of the second inverter circuit,
the second inverter circuit includes a second NMOS transistor, a drain of which is the output of the second inverter circuit and is connected to the input of the first inverter circuit,
a gate of the first PMOS transistor is the input of the first inverter circuit and a gate of the second NMOS transistor is the input of the second inverter circuit,
a first power supply voltage is supplied to the first inverter circuit to form an output voltage of the first inverter circuit, but is not utilized in the second inverter circuit to form an output voltage of the second inverter circuit, and
a second power supply voltage lower than the first power supply voltage is supplied to the second inverter circuit to form the output voltage of the second inverter circuit, but is not utilized in the first inverter circuit to form the output voltage of the first inverter circuit.

9. The semiconductor memory device of claim 8, wherein the read circuit includes:
a third NMOS transistor having a source connected to a first bit line, a gate connected to a word line and a drain connected to the output of the first inverter circuit; and
a fourth NMOS transistor having a source connected to a second bit line complementary to the first bit line, a gate connected to the world line and a drain connected to the output of the second inverter circuit.

10. The semiconductor memory device of claim 8, wherein:
the first inverter circuit further includes a first NMOS transistor, a gate of which is connected to the gate of the first PMOS transistor,
the read circuit includes:
a third NMOS transistor having a source connected to a first bit line, a gate connected to a word line and a drain connected to a drain of the first NMOS transistor; and
a fourth NMOS transistor having a source connected to a second bit line complementary to the first bit line, a gate connected to the world line and a drain connected to the output of the second inverter circuit, and
the drain of the first NMOS transistor is cut off from the drain of the first PMOS transistor.

11. The semiconductor memory device of claim 8, wherein:
the second inverter circuit further includes a second PMOS transistor, a gate of which is connected to the gate of the second NMOS transistor, and a drain of which is cut off from the drain of the second NMOS transistor.

12. The semiconductor memory device of claim 11, wherein the read circuit includes:
a third NMOS transistor having a source connected to a first bit line, a gate connected to a word line and a drain connected to the output of the first inverter circuit; and
a fourth NMOS transistor having a source connected to a second bit line complementary to the first bit line, a gate connected to the world line and a drain connected to the output of the second inverter circuit.

13. The semiconductor memory device of claim 8, wherein:
the first power supply voltage is supplied to a source of the first PMOS transistor, but not supplied to the second inverter circuit, and
the second power supply voltage is supplied to a source of the second NMOS transistor, but not supplied to the first inverter circuit.

14. The semiconductor memory device of claim 8, wherein:
the first inverter circuit includes only the first PMOS transistor as a transistor, and the second inverter circuit includes only the second NMOS transistor as a transistor.

* * * * *